(12) United States Patent
Okuyama

(10) Patent No.: US 10,153,323 B2
(45) Date of Patent: Dec. 11, 2018

(54) METHOD OF PRODUCING SEMICONDUCTOR EPITAXIAL WAFER, SEMICONDUCTOR EPITAXIAL WAFER, AND METHOD OF PRODUCING SOLID-STATE IMAGE SENSOR

(71) Applicant: SUMCO CORPORATION, Tokyo (JP)

(72) Inventor: Ryosuke Okuyama, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 15/104,396

(22) PCT Filed: Dec. 10, 2014

(86) PCT No.: PCT/JP2014/083315
§ 371 (c)(1),
(2) Date: Jun. 14, 2016

(87) PCT Pub. No.: WO2015/104965
PCT Pub. Date: Jul. 16, 2015

(65) Prior Publication Data
US 2016/0315117 A1    Oct. 27, 2016

(30) Foreign Application Priority Data
Jan. 7, 2014   (JP) .................................. 2014-001182

(51) Int. Cl.
*H01L 21/265* (2006.01)
*H01L 27/146* (2006.01)
*H01L 21/322* (2006.01)

(52) U.S. Cl.
CPC .. *H01L 27/14698* (2013.01); *H01L 21/26566* (2013.01); *H01L 21/3221* (2013.01);
(Continued)

(58) Field of Classification Search
CPC ... H01L 21/26566; H01L 21/26; H01L 21/22; H01L 21/223
See application file for complete search history.

(56) References Cited

U.S. PATENT DOCUMENTS 7,666,771 B2   2/2010  Krull et al.
8,097,529 B2   1/2012  Krull et al.
(Continued)

FOREIGN PATENT DOCUMENTS

CN    1892984 A       1/2007
JP    2003-163216    6/2003
(Continued)

OTHER PUBLICATIONS

Search Report issued for PCT/JP2014/083315, dated Mar. 31, 2015.
(Continued)

*Primary Examiner* — Jae Lee
(74) *Attorney, Agent, or Firm* — Greenblum & Bernstein, P.L.C.

(57) ABSTRACT

A production method for a semiconductor epitaxial wafer includes: a first step of irradiating a surface of a semiconductor wafer with cluster ions to form a modified layer that is located in a surface portion of the semiconductor wafer and that includes a constituent element of the cluster ions in solid solution; and a second step of forming an epitaxial layer on the modified layer of the semiconductor wafer. The first step is performed such that a portion of the modified layer in terms of a thickness direction becomes an amorphous layer and an average depth of an amorphous layer surface at a semiconductor wafer surface-side of the amorphous layer is at least 20 nm from the surface of the semiconductor wafer.

7 Claims, 6 Drawing Sheets

(52) U.S. Cl.
CPC .... *H01L 27/1464* (2013.01); *H01L 27/14632* (2013.01); *H01L 27/14687* (2013.01); *H01L 27/14692* (2013.01); *H01L 27/146* (2013.01)

(56) References Cited

U.S. PATENT DOCUMENTS

| | | |
|---|---|---|
| 8,530,343 B2 | 9/2013 | Krull et al. |
| 2003/0003692 A1 | 1/2003 | Suzuki et al. |
| 2007/0148888 A1 | 6/2007 | Krull et al. |
| 2007/0296037 A1* | 12/2007 | Dozen ............... H01L 23/49855 257/350 |
| 2009/0286367 A1 | 11/2009 | Krull et al. |
| 2011/0306193 A1 | 12/2011 | Krull et al. |
| 2014/0080247 A1* | 3/2014 | Kadono ............ H01L 21/02381 438/73 |

FOREIGN PATENT DOCUMENTS

| | | |
|---|---|---|
| JP | 2007-317760 | 12/2007 |
| JP | 2009-518869 | 5/2009 |
| JP | 2010-040864 | 2/2010 |
| JP | 2011-253983 | 12/2011 |
| TW | 2012-18250 | 5/2012 |
| TW | 2012-46298 | 11/2012 |
| WO | 2012-157162 | 11/2012 |

OTHER PUBLICATIONS

Office Action issued in Taiwan 10421382410, dated Oct. 15, 2015, along with an english translation thereof.

Office Action issued by Japan patent office in Japan Patent Application No. 2014-001182, dated Jun. 30, 2016, and an English translation thereof.

Office Action issued by Korea patent office in Korea Patent Application No. 2016-7016695, dated Jul. 6, 2016, and an English translation thereof.

Office Action issued by Korean patent office in Korea Patent Application No. 10-2016-7016695, dated Oct. 19, 2016, and an English translation thereof.

Korean Office Action (Trial decision) for Korean Patent Application No. 10-2016-7016695 dated Sep. 29, 2017, along with an English translation.

Office Action issued by Chinese patent office in Chinese Patent Application No. 201480068832.5, dated Feb. 4, 2017, and an English translation thereof.

Chinese Office Action issued for the Chinese Patent Application No. 201480068832.5 dated Aug. 31, 2017 along with an English translation thereof.

Chinese Office Action for Chinese Patent Application No. 201480068832.5 dated Feb. 5, 2018 along with an English translation thereof.

German Office Action issued for German Application No. 11 2014 005 494.1 dated Jun. 12, 2018 along with English translation.

Chinese Office Action issued for Chinese Application No. 201480068832.5 dated Jul. 4, 2018 along with English translation.

Rudawski et al., Amorphization and Solid-Phase Epitaxial Growth of C-Cluster Ion-Implanted Si, Journal of Electronic Materials, vol. 38, No. 9, 2009, pp. 1926-1930.

* cited by examiner

Comparative
example $1.0 \times 10^{15}$ atoms/cm$^2$

Example $2.0 \times 10^{15}$ atoms/cm$^2$

Example $3.0 \times 10^{15}$ atoms/cm$^2$

FIG.6 (A) Comparative example
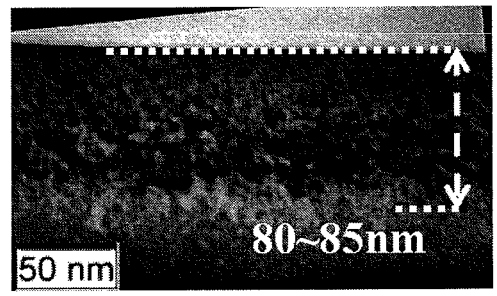
$1.0 \times 10^{15}$ atoms/cm$^2$
FIG.6 (B) Example
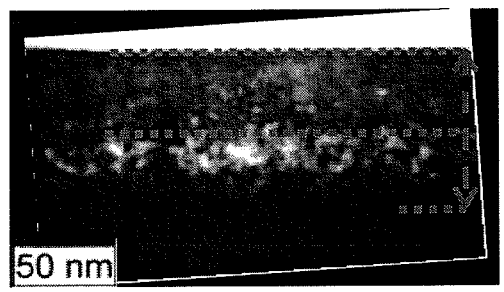
$1.7 \times 10^{15}$ atoms/cm$^2$
FIG.6 (C) Example
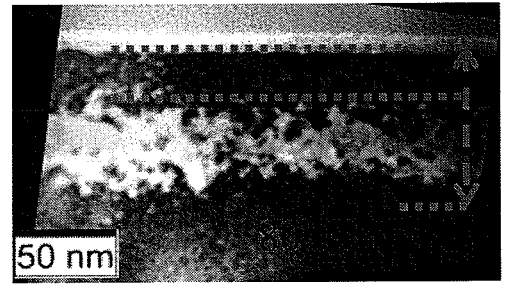
$2.0 \times 10^{15}$ atoms/cm$^2$
FIG.6 (D) Example
$3.0 \times 10^{15}$ atoms/cm$^2$

METHOD OF PRODUCING SEMICONDUCTOR EPITAXIAL WAFER, SEMICONDUCTOR EPITAXIAL WAFER, AND METHOD OF PRODUCING SOLID-STATE IMAGE SENSOR

TECHNICAL FIELD

The present disclosure relates to a method for producing a semiconductor epitaxial wafer, a semiconductor epitaxial wafer, and a method for producing a solid-state image sensor.

BACKGROUND

Metal contamination is one of the factors that cause deterioration in semiconductor device characteristics. For example, in the case of a back-illumination solid-state image sensor, metal that is mixed into a semiconductor epitaxial wafer used as a substrate of the image sensor is a factor causing increased dark current in the solid-state image sensor and causing defects referred to as white spot defects. In a back-illumination solid-state image sensor, a wiring layer and the like are provided in a lower layer than a sensor section such that external light can be directly taken in by the sensor, enabling clear images and videos to be recorded even in dark locations. For this reason, back-illumination solid-state image sensors have become widely used in recent years in digital video cameras and mobile telephones such as smart phones. Therefore, it is desirable to reduce white spot defects to as great an extent as possible.

Mixing of a metal into a wafer mainly occurs during a process of producing a semiconductor epitaxial wafer and a process of producing a solid-state image sensor (device production process). Metal contamination in the former process of producing a semiconductor epitaxial wafer may for example occur due to heavy metal particles from constituent materials of an epitaxial growth furnace or heavy metal particles produced through metal corrosion of piping materials as a result of a chlorine-containing gas being used in the furnace during epitaxial growth. The metal contamination described above has been improved to a certain extent in recent years through replacement of the constituent materials of epitaxial growth furnaces with materials having superior corrosion resistance; however, this improvement is still insufficient. On the other hand, in the latter process of producing a solid-state image sensor, heavy metal contamination of a semiconductor substrate is a concern during various processing steps such as ion implantation, diffusion, and oxidizing heat treatment.

One technique for inhibiting heavy metal contamination such as described above involves providing a gettering site in a semiconductor wafer for capturing heavy metals. In a known method using this technique, ions are implanted in a semiconductor wafer and an epitaxial layer is subsequently formed. In this method, a region into which the ions are implanted functions as a gettering site.

PTL 1 describes a semiconductor epitaxial wafer production method including: a first step of irradiating a surface of a semiconductor wafer with cluster ions to form a modified layer that is located in a surface portion of the semiconductor wafer and that includes a constituent element of the cluster is ions in solid solution; and a second step of forming an epitaxial layer on the modified layer of the semiconductor wafer.

CITATION LIST

Patent Literature

PTL 1: WO 2012/157162

SUMMARY

Technical Problem

PTL 1 demonstrates that higher gettering ability can be obtained through a modified layer formed by irradiation with cluster ions than through an ion implantation region formed by implantation of monomer ions (single ions). However, the present inventor recognized a new technical problem as described below. Specifically, the gettering ability of the modified layer in PTL 1 can for example be effectively increased by increasing the dose of cluster ions. However, the inventor ascertained that excessively increasing the dose causes a large number of epitaxial defects to occur in the subsequently formed epitaxial layer. PTL 1 does not consider how to achieve a balance of both improving gettering ability and suppressing occurrence of epitaxial defects, which leaves room for improvement in addressing this issue.

In light of the problem described above, an objective of the present disclosure is to provide a semiconductor epitaxial wafer that has high gettering ability and in which occurrence of epitaxial defects is suppressed, and also to provide a production method for this semiconductor epitaxial wafer.

Solution to Problem

The inventor reached the following findings as a result of further investigation.

(1) When a semiconductor wafer is irradiated with cluster ions, an amorphous region may or may not be formed in the modified layer depending on the irradiation conditions. Moreover, higher gettering ability can be obtained when an amorphous layer is present in a portion of the modified layer in terms of a thickness direction than when an amorphous region is not present in the modified layer. In other words, in order to obtain high gettering ability, it is necessary to carry out cluster ion irradiation under conditions that lead to formation of an amorphous layer in a portion of the modified layer in terms of the thickness direction.

(2) Epitaxial defects may occur due to damage near the surface (surface portion) of the semiconductor wafer resulting from cluster ion irradiation. The inventor discovered that the dose at which epitaxial defects start to occur differs depending on the type of cluster ions that are used. In other words, the inventor realized that occurrence of epitaxial defects is not dependent solely on the dose.

(3) As a result of further investigation, the inventor discovered that there is a correlation between the depth position of the amorphous layer in the modified layer and occurrence of epitaxial defects. Specifically, it is necessary to form the amorphous layer at at least a prescribed distance from the semiconductor wafer surface in order to suppress occurrence of epitaxial defects.

(4) Thus, in order to achieve a balance of high gettering performance and suppression of epitaxial defects, it is necessary for an amorphous layer to be formed in the modified layer by cluster ion irradiation and for the amorphous layer to be formed at at least a certain depth. The inventor also discovered that when an epitaxial layer is formed after cluster ion irradiation, crystallinity of the modified layer recovers due to heat during this epitaxial layer formation, which leads to loss of the amorphous layer and occurrence of black spot defects in the modified layer. Furthermore, the inventor realized that in a semiconductor epitaxial wafer in which epitaxial defects occur due to the amorphous layer being at a shallow depth position, the number of black spot defects described above increases excessively such that rather than being "black spot defects", these defects actually form a line-shaped defect layer of connected black spots. In other words, in the case of a semiconductor epitaxial wafer in which black spot defects are present in the modified layer, high gettering ability can be obtained and occurrence of epitaxial defects can be suppressed.

The key points of the present disclosure based on the above findings are as follows.

A method of producing a semiconductor epitaxial wafer according to the present disclosure includes:

a first step of irradiating a surface of a semiconductor wafer with cluster ions to form a modified layer that is located in a surface portion of the semiconductor wafer and that includes a constituent element of the cluster ions in solid solution; and a second step of forming an epitaxial layer on the modified layer of the semiconductor wafer, wherein the first step is performed such that a portion of the modified layer in terms of a thickness direction becomes an amorphous layer and an average depth of an amorphous layer surface at a semiconductor wafer surface-side of the amorphous layer is at least 20 nm from the surface of the semiconductor wafer.

The first step is preferably performed such that the average depth is at least 20 nm and no greater than 200 nm from the surface of the semiconductor wafer.

Moreover, the first step is preferably performed such that an average thickness of the amorphous layer is no greater than 100 nm.

The cluster ions preferably include carbon as a constituent element and more preferably include at least two elements as constituent elements of which one is carbon. The cluster ions preferably have a carbon number of no greater than 16.

A semiconductor epitaxial wafer according to the present disclosure includes: a semiconductor wafer; a modified layer located in a surface portion of the semiconductor wafer and including a prescribed element in solid solution within the semiconductor wafer; and an epitaxial layer located on the modified layer, wherein black spot defects are present in the modified layer.

The black spot defects are preferably present at a depth of at least 30 nm from a surface of the semiconductor wafer. The black spot defects preferably have a width of from 30 nm to 100 nm and a density of from $1.0 \times 10^8$ defects/cm$^2$ to $1.0 \times 10^{10}$ defects/cm$^2$.

The prescribed element preferably includes carbon and more preferably includes at least two elements of which one is carbon.

A method of producing a solid-state image sensor according to the present disclosure includes forming a solid-state image sensor in the epitaxial layer of the semiconductor epitaxial wafer produced by any one of the producing methods described above or of any one of the semiconductor epitaxial wafers described above.

Advantageous Effect

The semiconductor epitaxial wafer production method according to the present disclosure can provide a semiconductor epitaxial wafer that has high gettering ability and in which occurrence of epitaxial defects is suppressed. The semiconductor epitaxial wafer according to the present disclosure has high gettering ability and occurrence of epitaxial defects therein is suppressed.

BRIEF DESCRIPTION OF THE DRAWINGS

In the accompanying drawings:

FIGS. 5A-5C show TEM images of cross-sections of epitaxial silicon wafers (i.e., after epitaxial layer growth) in an experiment shown in FIG. 3, wherein FIG. 5A shows a situation in which the dose was $1.0 \times 10^{15}$ atoms/cm$^2$ (comparative example), FIG. 5B shows a situation in which the dose was $2.0 \times 10^{15}$ atoms/cm$^2$ (example), and FIG. 5C shows a situation in which the dose was $3.0 \times 10^{15}$ atoms/cm$^2$ (comparative example); and FIGS. 6A-6D show TEM images of cross-sections of modified layers after cluster ion irradiation and before epitaxial layer formation in the experiment shown in FIG. 3, wherein FIG. 6A shows a situation in which the dose was $1.0 \times 10^{15}$ atoms/cm$^2$ (comparative example), FIG. 6B shows a situation in which the dose was $1.7 \times 10^{15}$ atoms/cm$^2$ (example), FIG. 6C shows a situation in which the dose was $2.0 \times 10^{15}$ atoms/cm$^2$ (example), and FIG. 6D shows a situation in which the dose was $3.0 \times 10^{15}$ atoms/cm$^2$ (comparative example).

DETAILED DESCRIPTION

The following provides a detailed description of embodiments of the present disclosure with reference to the drawings. Note that thicknesses of a modified layer 14, an amorphous layer 16, and an epitaxial layer 18 are exaggerated relative to a semiconductor wafer 10 in FIG. 1 in order to facilitate explanation and thus the ratio of thicknesses in FIG. 1 differs from the actual ratio.

(Semiconductor Epitaxial Wafer Production Method)

Figure 1:
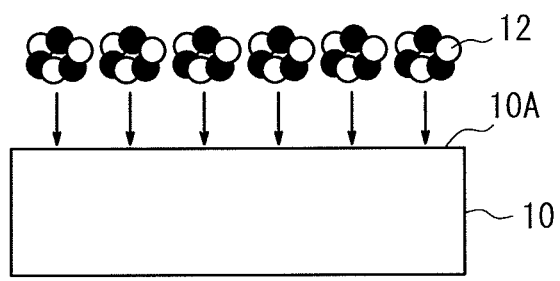
FIGS. 1A, 1B, and 1C are cross-sectional views schematically illustrating a method of producing a semiconductor epitaxial wafer 100 according to an embodiment of the present disclosure.
Figure 1:
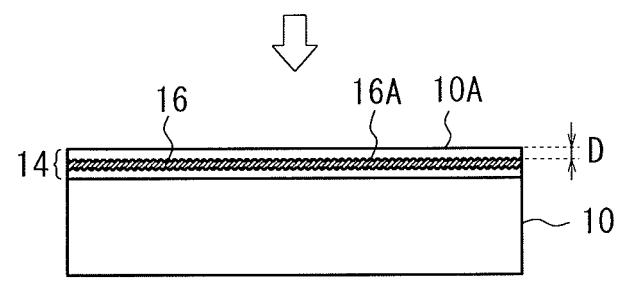
Figure 1:
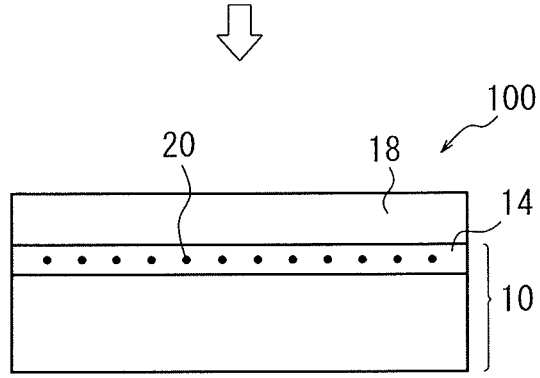

As illustrated in FIG. 1, a production method for a semiconductor epitaxial wafer 100 according to an embodiment of the present disclosure includes: a first step (FIGS. 1A and 1B) of irradiating a surface 10A of a semiconductor wafer 10 with cluster ions 12 to form a modified layer 14 that is located in a surface portion of the semiconductor wafer 10 and that includes a constituent element of the cluster ions 12 in solid solution; and a second step (FIG. 1C) of forming an epitaxial layer 18 on the modified layer 14 of the semiconductor wafer 10. FIG. 1C is a cross-sectional view schematically illustrating the semiconductor epitaxial wafer 100 obtained as a result of this production method. The epitaxial layer 18 forms a device layer for production of a semiconductor element such as a back-illumination solid-state image sensor.

The semiconductor wafer 10 is for example a bulk monocrystalline wafer that is made from silicon or a compound semiconductor (GaAs, GaN, or SiC) and that does not have an epitaxial layer at the surface. In the case of production of a back-illumination solid-state image sensor, the semiconductor wafer 10 is normally a bulk monocrystalline silicon wafer. The semiconductor wafer 10 can for example be obtained by growing a monocrystalline silicon ingot through the Czochralski method (CZ method) or the floating zone melting method (FZ method) and slicing the ingot using a wire saw or the like. Carbon and/or nitrogen may be added to the semiconductor wafer 10 in order to obtain higher gettering ability. Furthermore, a freely selected dopant may be added to the semiconductor wafer 10 in a prescribed concentration to obtain an n+ type, p+ type, n– type, or p– type substrate.

Alternatively, the semiconductor wafer 10 may be an epitaxial semiconductor wafer in which a semiconductor epitaxial layer has been formed on the surface of a bulk semiconductor wafer. For example, the semiconductor wafer 10 may be an epitaxial silicon wafer in which a silicon epitaxial layer has been formed on the surface of a bulk monocrystalline silicon wafer. The silicon epitaxial layer can be formed through CVD under normally used conditions. The thickness of the epitaxial layer is preferably in a range from 0.1 µm to 10 µm and more preferably in a range from 0.2 µm to 5 µm.

Herein, a cluster ion irradiation step illustrated in FIG. 1A is a characteristic step of the present embodiment. The technical significance of adopting this step is explained in addition to the action and effect thereof. The modified layer 14 formed as a result of irradiation with the cluster ions 12 is a region in a surface portion of the semiconductor wafer at which constituent elements of the cluster ions 12 are localized in solid solution at interstitial positions or substitution positions of the crystal. The modified layer 14 functions as a gettering site. The reason for this is thought to be as follows. Specifically, an element such as carbon that is irradiated in the form of cluster ions becomes localized in high density at interstitial positions or substitution positions in the silicon monocrystal. Furthermore, it has been confirmed experimentally that when carbon or the like in solid solution within the silicon monocrystal reaches an equilibrium concentration or greater, the solid solubility of heavy metals (saturation solubility of transition metals) increases significantly. In other words, dissolving carbon or the like in solid solution at the equilibrium concentration or greater is thought to increase the solid solubility of heavy metals such that the capture rate of these heavy metals is dramatically increased.

Note that the present description uses the term "cluster ion" to refer to an ionized product formed by applying positive charge or negative charge to a cluster of a plurality of atoms or molecules that are assembled into a single mass. The cluster is a lump-shaped group of atoms or molecules (normally from approximately 2 to 2,000) that are bound to one another.

Irradiation with the cluster ions 12 in the present embodiment allows higher gettering ability to be obtained than in a situation in which monomer ions are implanted. The inventor considers the action by which this effect is achieved to be as follows.

Figure 2:
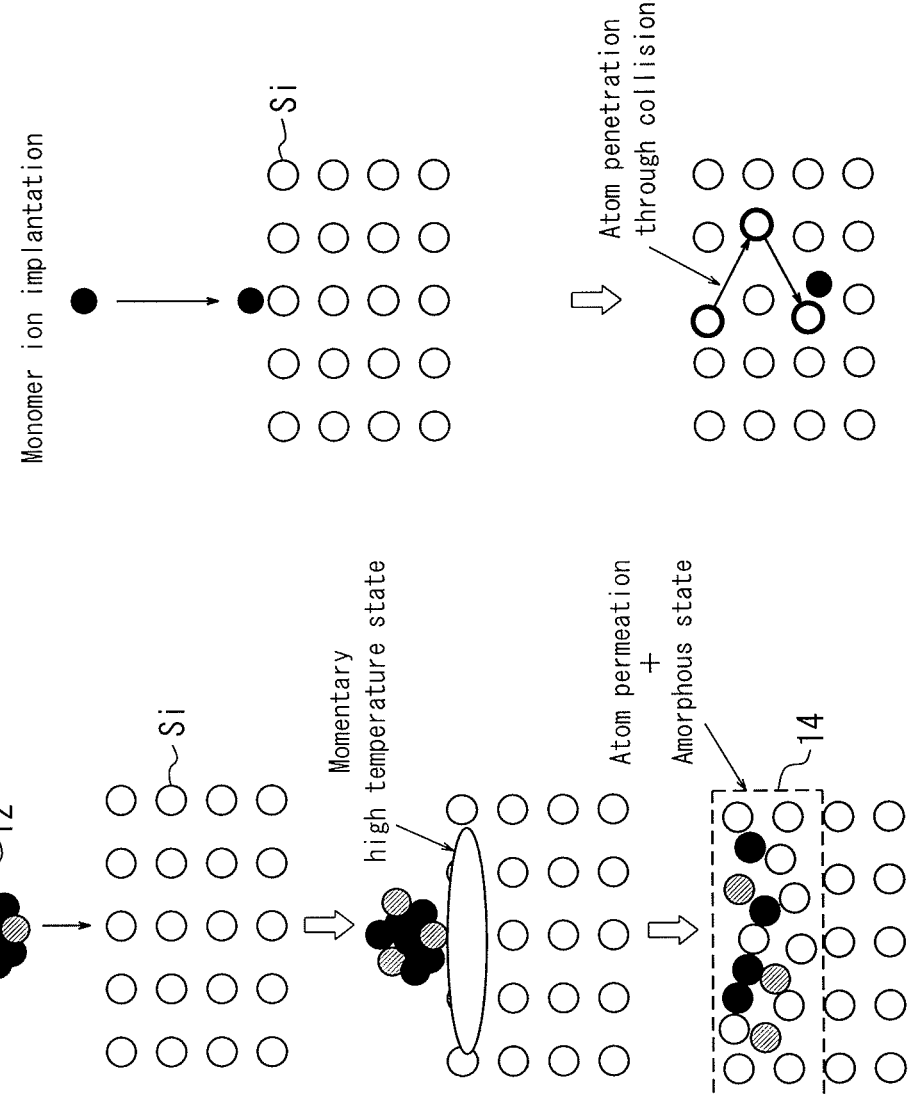
FIG. 2A is a schematic view illustrating an irradiation mechanism in irradiation with cluster ions and FIG. 2B is a schematic view illustrating an implantation mechanism in implantation of monomer ions.

In a situation in which, for example, carbon monomer ions are implanted in a silicon wafer, the monomer ions knock against silicon atoms forming the silicon wafer and become implanted at a prescribed depth position in the silicon wafer as illustrated in FIG. 2B. The implantation depth is dependent on the type of constituent element of the implanted ions and the acceleration voltage of the ions. In the situation described above, the depth direction concentration profile of carbon in the silicon wafer is relatively broad and a region in which carbon is implanted extends for roughly 0.5 µm to 1 µm. When different types of ions are irradiated simultaneously with the same energy, lighter elements tend to be implanted deeper. In other words, elements are implanted at different positions in accordance with their mass such that the implanted elements have a broader concentration profile.

On the other hand, in a situation in which a silicon wafer is irradiated with cluster ions formed, for example, from carbon and hydrogen, upon irradiation with the cluster ions 12 as illustrated in FIG. 2A, the energy of the cluster ions 12 causes the silicon wafer to momentarily reach a high temperature state of approximately 1,350° C. to 1,400° C. and melts the silicon. Thereafter, the silicon cools rapidly such that the carbon and hydrogen dissolve in solid solution near the surface of the silicon wafer. In other words, the "modified layer" in the present description is a layer in which constituent elements of the irradiated ions are in solid solution at interstitial positions or substitution positions in the crystal within a surface portion of the semiconductor wafer. The depth direction concentration profile of carbon in the silicon wafer is dependent on the acceleration voltage and the cluster size of the cluster ions. However, the concentration profile is sharper than in the case of monomer ions and the thickness of a region in which the irradiated carbon is localized (i.e., the modified layer) is roughly no greater than 500 nm (for example, approximately 50 nm to 400 nm). Note that an element that is irradiated in the form of cluster ions undergoes a certain degree of thermal diffusion during formation of the epitaxial layer 18. Consequently, the concentration profile of carbon after epitaxial layer 18 formation has a broad diffusion region on each side of a peak indicating where the aforementioned elements are localized. However, the thickness of the modified layer (i.e., the width of the peak) does not change significantly. Therefore, a localized and high concentration carbon deposition region can be formed. Moreover, formation of the modified layer 14 near the surface of the silicon wafer, and thus directly under the epitaxial layer 18, enables proximity gettering. It is thought that high gettering ability can be obtained as a result. Note that different types of ions may be irradiated simultaneously so long as the ions are in the form of cluster ions.

Furthermore, a feature of the present embodiment is that irradiation with cluster ions is performed such that, as illustrated in FIG. 1B, an amorphous layer 16 is formed in a portion of the modified layer 14 in terms of the depth direction and an average depth of an amorphous layer surface 16A at a semiconductor wafer surface-side of the amorphous layer 16 is at least 20 nm from the semiconductor wafer surface 10A. The gettering ability of the modified layer 14 described above can be improved as a result of the amorphous layer 16 being present in the modified layer 14. Therefore, a back-illumination solid-state image sensor produced from the semiconductor epitaxial wafer 100 that is obtained according to the present embodiment is expected to benefit from suppression of white spot defects. An average depth of at least 20 nm from the semiconductor wafer surface 10A for the surface 16A of the amorphous layer 16 allows sufficient suppression of occurrence of epitaxial defects in the subsequently formed epitaxial layer 18.

From a viewpoint of more effectively suppressing epitaxial defects, the average depth of the surface 16A of the amorphous layer 16 is preferably at least 20 nm and no greater than 200 nm from the semiconductor wafer surface 10A, and more preferably at least 20 nm and no greater than 80 nm from the semiconductor wafer surface 10A.

The average thickness of the amorphous layer 16 is preferably no greater than 100 nm and more preferably no greater than 60 nm. An average thickness of greater than 100 nm may make it difficult to select cluster irradiation conditions that ensure the depth of the surface 16A is at least 20 nm from the semiconductor wafer surface 10A.

Note that as illustrated in FIG. 1B and also FIGS. 6A-6D explained further below, the depth of the amorphous layer surface varies depending on the width direction position. In the present disclosure, the "average depth of the amorphous layer surface at the semiconductor wafer surface-side of the amorphous layer" is defined as the average depth of the surface in a transmission electron microscope (TEM) image obtained through observation of a cross-section of the amorphous layer using a TEM. The "average depth" is an intermediate depth between a shallowest position and a deepest position of a boundary between the amorphous layer and a crystalline region. The "average thickness of the amorphous layer" is defined as the average thickness of the amorphous layer in a TEM image and, more specifically, the difference between the average depths of two surfaces of the amorphous layer. The magnification of the TEM image should be of a level that enables the amorphous layer to be clearly observed; in the examples illustrated in FIG. 6, the magnification is ×500,000.

The cluster ions may include a variety of clusters depending on the binding mode and can be generated by commonly known methods such as described, for example, in the following documents. Gas cluster beam generation methods are described in (1) JP H9-41138 A and (2) JP H4-354865 A. Ion beam generation methods are described in (1) Charged Particle Beam Engineering, Junzo Ishikawa, ISBN 978-4-339-00734-3, Corona Publishing Co., Ltd.; (2) Electron/Ion Beam Engineering, The Institute of Electrical Engineers of Japan, ISBN 4-88686-217-9, Ohmsha. Ltd.; and (3) Cluster Ion Beam Fundamentals and Applications, ISBN 4-526-05765-7, Nikkan Kogyo Shimbun, Ltd. In general, a Nielsen ion source or a Kaufman ion source is used for generating positively charged cluster ions, whereas a high current negative ion source using volume generation is used for generating negatively charged cluster ions.

The following describes conditions of the cluster ion irradiation.

No specific limitations are placed on elements used for irradiation other than being elements that contribute to gettering. Examples of elements that can be used include carbon, boron, phosphorous, and arsenic. However, it is preferable that the cluster ions include carbon as a constituent element from a viewpoint of obtaining higher gettering ability. Carbon atoms at lattice positions have a small covalent radius compared to the silicon monocrystal and form contraction sites in the silicon crystal lattice, which results in high gettering ability of attracting interstitial impurities.

The irradiated elements are preferably at least two elements of which one is carbon. In particular, it is preferable that one or more dopant elements selected from the group consisting of boron, phosphorus, arsenic, and antimony are irradiated in addition to carbon. The types of metals that can be effectively gettered differ depending of the types of elements that are in solid solution. Therefore, providing at least two elements in solid solution makes it possible to deal with a wider range of metal contaminants. For example, nickel can be effectively gettered using carbon, whereas copper and iron can be effectively gettered using boron.

No specific limitations are placed on compounds that are ionized. Examples of carbon source compounds that can be ionized include ethane, methane, and carbon dioxide ($CO_2$), whereas examples of boron source compounds that can be ionized include diborane and decaborane ($B_{10}H_{14}$). For example, in a situation in which a mixed gas of dibenzil and decaborane is used as a material gas, hydrogenated compound clusters in which carbon, boron, and hydrogen are aggregated can be produced. Alternatively, in a situation which cyclohexane ($C_6H_{12}$) is used as a material gas, cluster ions formed from carbon and hydrogen can be produced. Clusters $C_nH_m$ ($3 \leq n \leq 16$, $3 \leq m \leq 10$) produced from pyrene ($C_{16}H_{10}$), dibenzil ($C_{14}H_{14}$), or the like are particularly preferable as a carbon source compound. The reason for the above is that a beam of small cluster ions can be easily controlled.

The compound that is ionized is preferably a compound that includes both carbon and the previously mentioned dopant element. When a compound such as described above is irradiated as cluster ions, carbon and the dopant element can both be provided in solid solution through a single irradiation.

Whether or not an amorphous layer is formed in the modified layer and the average depth of the surface 16A of the amorphous layer 16 when formation does occur are controlled through cluster ion dose, cluster size, cluster ion acceleration voltage, beam current, and so forth, and are particularly dependent on the dose and the cluster size. The present description uses the term "cluster size" to refer to the number of atoms or molecules forming a single cluster.

The cluster size can be set as appropriate as from 2 to 100 atoms/molecules, preferably no greater than 60 atoms/molecules, and more preferably no greater than 50 atoms/molecules. In the examples described further below, $C_3H_5$ having a cluster size of 8 and $C_3H_3$ having a cluster size of 6 were used. The cluster size can for example be adjusted by adjusting the pressure of gas sprayed from a nozzle, the pressure in a vacuum vessel, and the voltage applied to a filament during ionization. Note that the cluster size can be calculated by obtaining a cluster number distribution by mass spectrometry using a quadrupole high frequency electric field or time-of-flight mass spectrometry and taking an average value of the cluster numbers.

The dose of cluster ions can be adjusted by controlling the ion irradiation time. In the present embodiment, the dose is required to be roughly at least $1 \times 10^{15}$ atoms/cm$^2$ in order to form the amorphous layer 16 in the modified layer 14. In the examples described further below, an amorphous layer was formed in a modified layer through a carbon dose of at least $1.7 \times 10^{15}$ atoms/cm$^2$ when $C_3H_5$ cluster ions were used (refer to FIG. 3) and a carbon dose of at least $2.2 \times 10^{15}$ atoms/cm$^2$ when $C_3H_3$ cluster ions were used (refer to FIG. 4). Furthermore, the dose is required to be roughly no greater than $1 \times 10^{16}$ atoms/cm$^2$ in order that the average depth of the surface 16A at the semiconductor wafer surface-side of the amorphous layer 16 is least 20 nm from the semiconductor wafer surface 10A. In the examples described further below, the average depth of the surface 16A was at least 20 nm from the semiconductor wafer surface 10A through a carbon dose of no greater than $2.0 \times 10^{15}$ atoms/cm$^2$ when $C_3H_5$ cluster ions were used (refer to FIG. 3) and a carbon dose of no greater than $2.6 \times 10^{15}$ atoms/cm² when $C_3H_3$ cluster ions were used (refer to FIG. 4).

The acceleration voltage of the cluster ions, in combination with the cluster size, influences the position of a peak in the depth direction concentration profile of a constituent element in the modified layer 18 and thus also indirectly influences the depth of the amorphous layer. In a situation in which $C_nH_m$ (3≤n≤16, 3≤m≤10) cluster ions are used, the acceleration voltage per one carbon atom is required to be greater than 0 keV/atom and no greater than 50 keV/atom, and preferably no greater than 40 keV/atom, in order that the average depth of the surface 16A at the semiconductor wafer surface-side of the amorphous layer 16 is at least 20 nm from the semiconductor wafer surface 10A.

Adjustment of the acceleration voltage is usually performed by two methods: (1) electrostatic acceleration and (2) high-frequency acceleration. The former method is for example a method in which electrodes are arranged at equal intervals and the same voltage is applied between the electrodes such that a constant accelerating field is formed in an axial direction. The latter method is for example a linac (linear accelerator) method in which ions are caused to travel along a straight line while being accelerated by high-frequency waves.

The beam current is required to be roughly at least 100 μA and no greater than 1,000 μA in order that the amorphous layer 16 is formed in the modified layer 14 and in order that the average depth of the surface 16A of the amorphous layer 16 is at least 20 nm from the semiconductor wafer surface 10A.

The following describes heat treatment in the present embodiment Monomer ions are normally implanted with an acceleration voltage of approximately 150 keV to 2,000 keV and as a result of each of the ions colliding with a silicon atom with this energy, crystallinity of a surface portion of the silicon wafer in which the monomer ions are implanted is disturbed and crystallinity of an epitaxial layer subsequently grown on the wafer surface is also disturbed. On the other hand, cluster ions are normally irradiated with an acceleration voltage of approximately 10 keV/cluster to 100 keV/cluster and the cluster ions can be caused to impact with a small energy per one atom or molecule because each cluster is an aggregate of a plurality of atoms or molecules. Consequently, the extent of damage to the semiconductor wafer crystal is small. Therefore, in one embodiment, the semiconductor epitaxial wafer 100 having high gettering ability can be effectively produced by performing the first step and then transferring the semiconductor wafer to an epitaxial growth apparatus to carry out the second step without subjecting the semiconductor wafer to heat treatment after the first step to allow recovery of crystallinity. In other words, it is not necessary to perform recovery heat treatment using a rapid heating and cooling heat treatment apparatus such as a rapid thermal annealing (RTA) apparatus or a rapid thermal oxidation (RTO) apparatus that is separate to the epitaxial apparatus.

The reason for this is that crystallinity of the semiconductor wafer 10 can sufficiently recover during hydrogen baking treatment that is performed in advance of epitaxial growth in the epitaxial apparatus for forming the epitaxial layer 18, which is described further below. Normal conditions for the hydrogen baking treatment involve providing a hydrogen environment in the epitaxial growth apparatus, loading the semiconductor wafer 10 into a furnace of the apparatus at an internal furnace temperature of at least 600° C. and no greater than 900° C., heating at a rate of at least 1° C./s and no greater than 15° C./s to a temperature of at least 1,100° C. and no greater than 1,200° C., and holding the semiconductor wafer 10 for at least 30 seconds and no greater than 1 minute at the aforementioned temperature. Although the original purpose of this hydrogen baking treatment is to remove a natural oxide film formed on the wafer surface due to washing treatment prior to epitaxial layer growth, hydrogen baking performed under the conditions described above also enables sufficient recovery of crystallinity of the semiconductor wafer 10.

It should be noted that alternatively, recovery heat treatment may of course be performed after the first step and prior to the second step using a heat treatment apparatus that is separate from the epitaxial apparatus. The recovery heat treatment is performed for at least 10 seconds and no greater than 1 hour at at least 900° C. and no greater than 1,200° C. The recovery heat treatment can for example be performed using a rapid heating and cooling heat treatment apparatus, such as an RTA apparatus or an RTO apparatus, or a batch heat treatment apparatus (vertical heat treatment apparatus or horizontal heat treatment apparatus) before transferring the semiconductor wafer 10 into the epitaxial growth apparatus.

The epitaxial layer 18 formed on the modified layer 14 is for example a silicon epitaxial layer and can be formed under normally used conditions.

For example, a source gas such as dichlorosilane or trichlorosilane may be introduced into a chamber using hydrogen as a carrier gas and epitaxial growth may be performed on the semiconductor wafer 10 by CVD at a temperature in range of roughly 1,000° C. to 1,200° C., although the growth temperature does differ depending on the source gas. The epitaxial layer 18 preferably has a thickness in a range of from 1 μm to 15 μm. A thickness of less than 1 μm may cause a change in resistivity of the epitaxial layer 18 due to outward diffusion of dopant from the semiconductor wafer 10 and a thickness of greater than 15 μm may affect spectral sensitivity characteristics of the solid-state image sensor.

(Semiconductor Epitaxial Wafer)

The following describes the semiconductor epitaxial wafer 100 that is obtained through the production method described above. As illustrated in FIG. 1C, the semiconductor epitaxial wafer 100 includes the semiconductor wafer 10, the modified layer 14 that is located in the surface portion of the semiconductor wafer 10 and that includes the prescribed element in solid solution within the semiconductor wafer 10, and the epitaxial layer 18 located on the modified layer 14.

The modified layer 14 is defined as previously explained and can be identified as a steep peak section in a depth direction concentration profile of the prescribed element which is obtained by performing elemental analysis in the depth direction from the surface 10A of the semiconductor wafer 10 using a secondary ion mass spectrometer (SIMS). The modified layer 14 normally extends from the surface 10A of the semiconductor wafer 10 to a depth in a range of from 50 nm to 400 nm from the surface 10A.

As illustrated in FIG. 1C and also FIG. 5B described further below, black spot defects 20 are present in the modified layer 18. The present description uses the term "black spot defect" to refer to a defect that is observed as a black spot in the modified layer 14 when a cleaved cross-section of the semiconductor epitaxial wafer 100 is observed by a TEM in bright field mode. According to investigation conducted by the inventor, black spot defects only occur in the modified layer 14 after formation of the epitaxial layer 18 in a situation in which the amorphous layer 16 has been formed in the modified layer 14 after irradiation with the cluster ions 12. On the other hand, black spot defects do not occur in the modified layer after formation of the epitaxial layer in a situation in which an amorphous layer has not been formed in the modified layer.

The mechanism by which black spot defects occur is thought to be as described below. Specifically, it is presumed that in a recrystallization step in which the amorphous layer formed in the modified layer prior to epitaxial layer formation undergoes crystallinity recovery due to heat energy received during epitaxial growth, not only silicon atoms, but also cluster elements (for example, carbon atoms) introduced through cluster irradiation, oxygen atoms in the silicon wafer, and so forth are taken into the recrystallized region such that the recrystallized region is in a composite clustered defect form, which is observed as black spot-shaped defects.

According to investigation by the inventor, high gettering ability is obtained by the semiconductor epitaxial wafer 100 in which the black spot defects 20 are present. Furthermore, the inventor discovered that occurrence of epitaxial defects can be suppressed when the average depth of the amorphous layer surface 16A is at least 20 nm from the semiconductor wafer surface 10A, whereas a line-shaped defect layer of connected black spots is formed when the amorphous layer becomes so thick that the average depth is less than 20 nm, and this line-shaped defect layer acts as a starting point for formation of epitaxial defects.

In the present embodiment, the density of epitaxial defects in the epitaxial layer 18 can be kept to no greater than 0.04 defects/cm$^2$ as a result of the average depth of the amorphous layer surface 16A in the modified layer 14 being at least 20 nm from the semiconductor wafer surface 10A prior to formation of the epitaxial layer 18.

From a viewpoint of suppressing occurrence of epitaxial defects, the black spot defects are preferably present at a depth of at least 30 nm from the semiconductor wafer surface.

In terms of size, the black spot defects have a width (wafer radial direction) of approximately 30 nm to 100 nm and a height (wafer thickness direction) of approximately 20 nm to 60 nm. The density of the black spot defects is preferably from $1.0\times10^8$ defects/cm$^2$ to $1.0\times10^{10}$ defects/cm$^2$. A density of at least $1.0\times10^8$ defects/cm$^2$ enables the effect of suppressing occurrence of epitaxial defects to be sufficiently realized. A density of no greater than $1.0\times10^{10}$ defects/cm$^2$ ensures that a line-shaped defect layer such as described above is not formed.

No specific limitations are placed on the prescribed element other than being an element that is not a main material of the semiconductor wafer (i.e., silicon in the case of a silicon wafer). As explained above, the prescribed element is preferably carbon or at least two elements of which one is carbon.

The semiconductor epitaxial wafer 100 according to the present embodiment has high gettering ability and occurrence of epitaxial defects therein is suppressed.

(Solid-state Image Sensor Production Method)

A solid-state image sensor production method according to an embodiment of the present disclosure includes forming a solid-state image sensor in the epitaxial layer at the surface of the semiconductor epitaxial wafer described above or of a semiconductor epitaxial wafer produced by the production method described above (in other words, in the epitaxial layer 18 at the surface of the semiconductor epitaxial wafer 100). The solid-state image sensor obtained through the above-described production method can more sufficiently suppress occurrence of white spot defects than conventionally.

EXAMPLES

Experimental Example 1

Comparative Example

An n type silicon wafer (diameter: 300 mm, thickness 725 µm, dopant: phosphorus, dopant concentration: $5.0\times10^{14}$ atoms/cm$^3$) was prepared from a CZ monocrystalline silicon ingot. Next, a cluster ion generating apparatus (model: CLARIS, produced by Nissin Ion Equipment Co., Ltd.) was used to generate $C_3H_5$ clusters from cyclohexane and irradiate the surface of the silicon wafer with a carbon dose of $1.0\times10^{15}$ atoms/cm$^2$ to form a modified layer. The acceleration voltage per one carbon atom was 23.4 keV/atom and the beam current was 400 µA.

FIG. 6A is an image observed by a TEM of a cross-section around the modified layer after cluster ion irradiation. It can be seen from FIG. 6A that an amorphous layer was not formed in the modified layer; note that an amorphous layer is indicated by white sections such as in FIGS. 6B-6D.

Next, the silicon wafer was transferred into a single wafer epitaxial growth apparatus (produced by Applied Materials, Inc.) and was subjected to hydrogen baking treatment in the apparatus for 30 seconds at 1,120° C. Thereafter, a silicon epitaxial layer (thickness: 8 tµm, dopant: phosphorous, dopant concentration: $1.0\times10^{15}$ atoms/cm$^3$) was grown on the modified layer of the silicon wafer by CND at 1,150° C. using hydrogen as a carrier gas and trichlorosilane as a source gas. A silicon epitaxial wafer was obtained as a result.

Figure 5A:
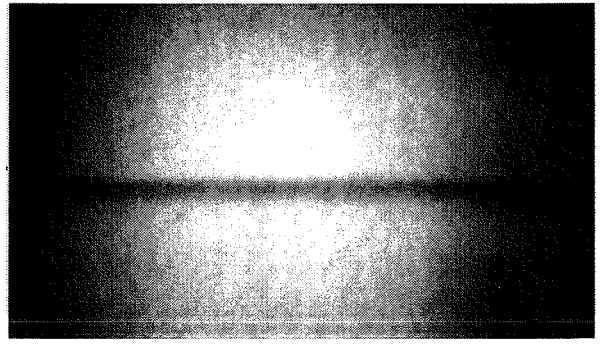

Concentration profiles of carbon and hydrogen were measured by SIMS. The modified layer could be identified by confirming the presence of a steep peak within a range of 80 nm from the silicon wafer surface. A cross-section around the modified layer of the silicon epitaxial wafer was observed using a TEM. The modified layer is indicated by the black belt-shaped section in the image shown in FIG. 5A, but black spot defects were not observed.

Example

An experiment was conducted in the same way as in the comparative example with the exception that the carbon dose was changed to $2.0\times10^{15}$ atoms/cm$^2$. After cluster ion irradiation, a cross-section around a modified layer was observed using a TEM. As shown in FIG. 6C, an amorphous layer was formed in the modified layer. The white section in FIG. 6C indicates the amorphous layer.

Concentration profiles of carbon and hydrogen were measured by SIMS after epitaxial layer formation. The modified layer could be identified by confirming the presence of a steep peak within a range of 80 nm from the silicon wafer surface. A cross-section around the modified layer of the silicon epitaxial wafer was observed. The modified layer is indicated by the black belt-shaped section in the image shown in FIG. 5B and black spot defects were observed in the modified layer.

<Evaluation of Gettering Ability>

The surface of the silicon epitaxial wafer produced in each of the comparative example and the example was deliberately contaminated by a spin coating contamination method using a Ni contaminant liquid and an Fe contaminant liquid (each $1.2\times10^{13}$/cm$^2$) and was then subjected to heat treatment for 30 minutes at 900° C. Thereafter, the concentrations of Ni and Fe captured in the modified layer were measured by SIMS. The results are shown in Table 1.

TABLE 1

|  | Comparative example | Example |
|---|---|---|
| Amount of captured Ni [atoms/cm$^2$] | $5.0 \times 10^{12}$ | $1.1 \times 10^{13}$ |
| Amount of captured Fe [atoms/cm$^2$] | $1.0 \times 10^{12}$ | $9.0 \times 10^{12}$ |

The example exhibited higher gettering ability than the comparative example. In the example, it is thought that formation of the amorphous layer in the modified layer led to recrystallization in a region of the amorphous layer after epitaxial layer formation and that this region also contributed as a gettering site.

Experimental Example 2

Figure 3:
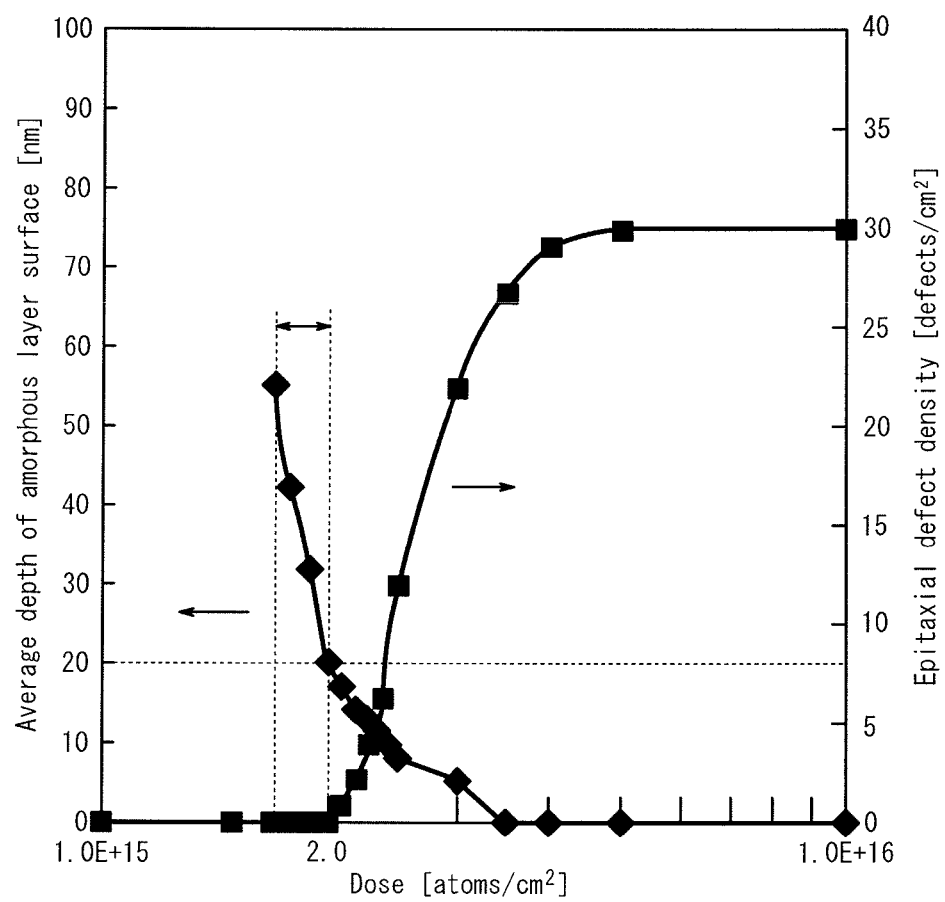
FIG. 3 is a graph illustrating a relationship between dose and average depth of an amorphous layer surface and a relationship between dose and epitaxial defect density when acceleration voltage and beam current are fixed in a situation in which $C_3H_5$ cluster ions are used.

As illustrated by the plot in FIG. 3, silicon epitaxial wafers were prepared in the same way as Experimental Example 1 but with different carbon doses ranging from $1.0\times10^{15}$ atoms/cm$^2$ to $1.0\times10^{16}$ atoms/cm$^2$.

After cluster ion irradiation, a cross-section around each modified layer was observed using a TEM. Measurements were performed to determine whether or not an amorphous layer was formed in each of the modified layers and, in a situation in which an amorphous layer was formed, to determine the average depth of the amorphous layer surface at the semiconductor wafer surface-side of the amorphous layer and the average thickness of the amorphous layer. Representative examples of TEM images are shown in FIG. 6A for when the dose was $1.0\times10^{15}$ atoms/cm$^2$, FIG. 6B for when the dose was $1.7\times10^{15}$ atoms/cm$^2$, FIG. 6C for when the dose was $2.0\times10^{15}$ atoms/cm$^2$, and FIG. 6D for when the dose was $3.0\times10^{15}$ atoms/cm$^2$. The average depth of the surface at the semiconductor wafer surface-side of the amorphous layer was 55 nm in FIG. 6B, 20 nm in FIG. 6C, and 5 nm in FIG. 6D. The average thickness of the amorphous layer was 5 nm in FIG. 6B, 30 nm in FIG. 6C, and 60 nm in FIG. 6D. FIG. 3 illustrates the relationship between the dose and the average depth. An amorphous layer was not formed. when the dose was less than $1.7\times10^{15}$ atoms/cm$^2$. The average depth was at least 20 nm when the dose was at least $1.7\times10^{15}$ atoms/cm$^2$ and no greater than $2.0\times10^{15}$ atoms/cm$^2$.

The surface of the silicon epitaxial layer of each of the epitaxial silicon wafers was measured by a Surfscan SP1 (produced by KLA-Tencor Corporation) in normal mode and among defects counted as LPDs of at least 90 nm, each defect counted as an LPD-N was defined as an epitaxial defect. FIG. 3 illustrates the relationship between the dose and the density of epitaxial defects. Epitaxial defects occurred with a density exceeding 0.04 defects/cm$^2$ when the dose exceeded $2.0\times10^{15}$ atoms/cm$^2$.

The results explained above demonstrate that when an acceleration voltage per one carbon atom of 23.4 keV/atom and a beam current of 400 μA are fixed in a situation in which C$_3$H$_5$ cluster ions are used, a dose of at least $1.7\times10^{15}$ atoms/cm$^2$ enables formation of an amorphous layer and provision of high gettering ability, whereas a dose of no greater than $2.0\times10^{15}$ atoms/cm$^2$ enables an average depth of at least 20 nm and suppression of epitaxial defects.

Figure 5B:
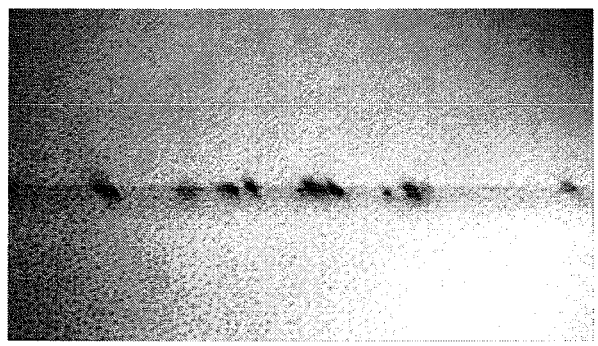
Figure 5C:
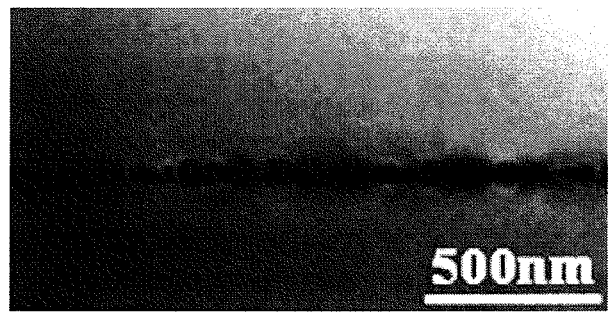

Moreover, when the dose was at least $1.7\times10^{15}$ atoms/cm$^2$ and no greater than $2.0\times10^{15}$ atoms/cm$^2$, black spot defects were observed after epitaxial layer formation as representatively illustrated in FIG. 5B described above. Black spot defects were not observed when the dose was less than $1.7\times10^{15}$ atoms/cm$^2$, When the dose was greater than $2.0\times10^{15}$ atoms/cm$^2$, black spot defects were not observed, but a line-shaped defect layer of connected black spots was observed as representatively illustrated in FIG. 5C.

Table 2 shows the depth of black spot defects from the silicon wafer surface, the width of black spot defects, and the density of black spot defects for four sets of experimental conditions in which black spot defects were observed.

TABLE 2

| Black spot defects | Carbon dose [atoms/cm$^2$] | | | |
|---|---|---|---|---|
|  | 1.70E+15 | 1.80E+15 | 1.90E+15 | 2.00E+15 |
| Depth [nm] | 58 | 46 | 39 | 30 |
| Width [nm] | 31 | 47 | 67 | 79 |
| Density [defects/cm$^2$] | $3.8 \times 10^8$ | $7.4 \times 10^8$ | $2.4 \times 10^9$ | $8.9 \times 10^9$ |

Experimental Example 3

Figure 4:
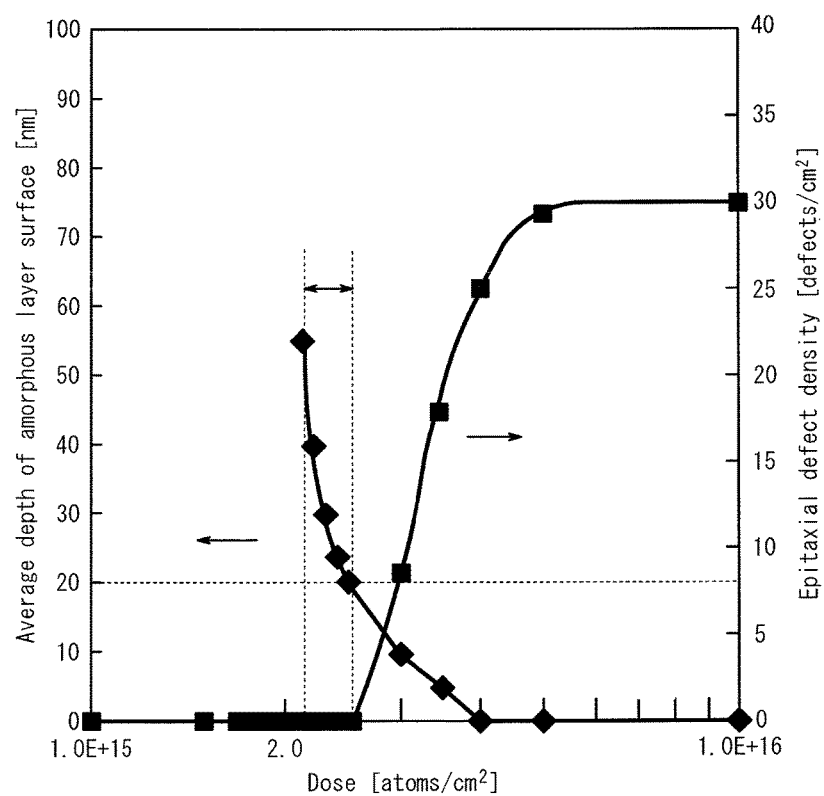
FIG. 4 is a graph illustrating a relationship between dose and average depth of an amorphous layer surface and a relationship between dose and epitaxial defect density when acceleration voltage and beam current are fixed in a situation in which $C_3H_3$ cluster ions are used.

An experiment was conducted in the same way as in Experimental Example 2 with the exception that the type of cluster ions was changed to C$_3$H$_3$ clusters generated from cyclohexane. FIG. 4 illustrates the results of the experiment. In Experimental Example 3, a dose of at least $2.2\times1^{15}$ atoms/cm$^2$ enabled amorphous layer formation and provision of high gettering ability, whereas a dose of no greater than $2.6\times10^{15}$ atoms/cm$^2$ enabled an average depth of at least 20 nm and suppression of epitaxial defects.

Moreover, when the dose was at least $2.2\times10^{15}$ atoms/cm$^2$ and no greater than $2.6\times10^{15}$ atoms/cm$^2$, black spot defects were observed after epitaxial layer formation. Black spot defects were not observed when the dose was less than $2.2\times10'$ atoms/cm$^2$. When the dose was greater than $2.6\times10^{15}$ atoms/cm$^2$, black spot defects were not observed, but a line-shaped defect layer of connected black spots was observed.

Table 3 shows the depth of black spot defects from the silicon wafer surface, the width of black spot defects, and the density of black spot defects for five sets of experimental conditions in which black spot defects were observed.

TABLE 3

| Black spot defects | Carbon dose [atoms/cm$^2$] | | | | |
|---|---|---|---|---|---|
|  | 2.20E+15 | 2.30E+15 | 2.40E+15 | 2.50E+15 | 2.60E+15 |
| Depth [nm] | 65 | 54 | 42 | 38 | 32 |
| Width [nm] | 30 | 45 | 58 | 73 | 89 |
| Density [defects/cm$^2$] | $1.3 \times 10^8$ | $6.7 \times 10^8$ | $1.6 \times 10^9$ | $4.3 \times 10^9$ | $9.4 \times 10^9$ |

INDUSTRIAL APPLICABILITY

The present disclosure can provide a semiconductor epitaxial wafer having high gettering ability and in which occurrence of defects in an epitaxial layer is suppressed and can provide a method for producing this semiconductor epitaxial wafer.

REFERENCE SIGNS LIST 100 semiconductor epitaxial wafer
10 semiconductor wafer

10 A semiconductor wafer surface
12 cluster ion
14 modified layer
16 amorphous layer
16A surface at semiconductor wafer surface-side of amorphous layer
18 epitaxial layer
20 black spot defect

The invention claimed is:

1. A method of producing a semiconductor epitaxial wafer, comprising:
    irradiating a surface of a semiconductor wafer with cluster ions to form a modified layer located in a surface portion of the semiconductor wafer, the modified layer including a constituent element of the cluster ions in solid solution; and
    forming an epitaxial layer on the modified layer of the semiconductor wafer,
    wherein the irradiating is performed such that a portion of the modified layer in a thickness direction becomes an amorphous layer and an average depth of an amorphous layer surface at a semiconductor wafer surface-side of the amorphous layer is at least 20 nm from the surface of the semiconductor wafer, and
    wherein a carbon dose no greater than $2 \times 10^{15}$ atoms/cm$^2$ is used when C$_3$H$_5$ cluster ions are used in the irradiating, and a carbon dose no greater than $2.6 \times 10^{15}$ atoms/cm$^2$ is used when C$_3$H$_3$ cluster ions are used in the irradiating.

2. The method of producing a semiconductor epitaxial wafer of claim 1, wherein the irradiating is performed such that the average depth is at least 20 nm and no greater than 200 nm from the surface of the semiconductor wafer.

3. The method of producing a semiconductor epitaxial wafer of claim 1, wherein the irradiating is performed such that an average thickness of the amorphous layer is no greater than 100 nm.

4. The method of producing a semiconductor epitaxial wafer of claim 1, wherein the cluster ions have a carbon number of no greater than 16.

5. A method of producing a solid-state image sensor, comprising
    forming a solid-state image sensor in the epitaxial layer of the semiconductor epitaxial wafer produced by the producing method of claim 1.

6. The method of producing a semiconductor epitaxial wafer of claim 1, wherein the average depth is no greater than 80 nm from the surface of the semiconductor wafer.

7. The method of producing a semiconductor epitaxial wafer of claim 1,
    wherein a carbon dose no greater than $1 \times 10^{16}$ atoms/cm$^2$ is used in the irradiating.

* * * * *